United States Patent
Jeong et al.

(10) Patent No.: US 7,697,652 B2
(45) Date of Patent: Apr. 13, 2010

(54) RECOVERY OF CLOCK AND DATA USING QUADRATURE CLOCK SIGNALS

(75) Inventors: Dae-Seung Jeong, Seoul (KR); Ueda Kimio, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1663 days.

(21) Appl. No.: 10/779,677

(22) Filed: Feb. 18, 2004

(65) Prior Publication Data
US 2004/0258187 A1 Dec. 23, 2004

(30) Foreign Application Priority Data
Jun. 19, 2003 (KR) .................. 10-2003-0039613

(51) Int. Cl.
*H03D 3/24* (2006.01)
(52) U.S. Cl. .............. 375/376; 375/215; 375/294; 375/373; 375/375
(58) Field of Classification Search ............ 375/340, 375/376, 215, 294, 373, 375; 327/12, 165, 327/411; 398/155
See application file for complete search history.

(56) References Cited

U.S. PATENT DOCUMENTS

| | | | | |
|---|---|---|---|---|
| 5,506,874 A | * | 4/1996 | Izzard et al. ................ 375/340 |
| 6,072,337 A | * | 6/2000 | Dalmia et al. ................ 327/12 |
| 6,642,771 B1 | * | 11/2003 | Smetana ..................... 327/411 |
| 6,847,789 B2 | * | 1/2005 | Savoj ......................... 398/155 |
| 7,103,131 B1 | * | 9/2006 | Byran et al. ................ 375/375 |
| 2002/0021470 A1 | | 2/2002 | Savoj |
| 2002/0079938 A1 | * | 6/2002 | Saeki ......................... 327/165 |
| 2004/0030513 A1 | * | 2/2004 | Kocaman et al. ............. 702/79 |
| 2004/0096013 A1 | * | 5/2004 | Laturell et al. .............. 375/316 |

OTHER PUBLICATIONS

Jonathan E. Rogers et al., A 10-Gb/S CDR/DEMUX With LC Delay Line VCO in 0.18 um CMOS, IEEE Journal of Solid-State Circuits, vol. 37, No. 12, Dec. 2002, (pp. 1781-1789).*

* cited by examiner

*Primary Examiner*—Shuwang Liu
*Assistant Examiner*—Kabir A Timory
(74) *Attorney, Agent, or Firm*—Harness, Dickey & Pierce, P.L.C.

(57) ABSTRACT

A quarter-rate phase detector can include: four latches controllable to latch, at different times according to quadrature clock signals, respectively, data received by the phase detector so as to form latched signals; an error circuit to combine corresponding ones of the latched signals, respectively, resulting in a plurality of intermediate signals; and a multiplexing unit to selectively output the intermediate signals as a phase error signal. A related method can have similar features.

22 Claims, 9 Drawing Sheets

| I | Q | ERROR |
|---|---|-------|
| 1 | 1 | E1 |
| 0 | 1 | E2 |
| 0 | 0 | E3 |
| 1 | 0 | E4 |

RECOVERY OF CLOCK AND DATA USING QUADRATURE CLOCK SIGNALS

BACKGROUND OF THE PRESENT INVENTION

In an asynchronous serial data link, there is no common clock connection between the device sending the data and the device receiving that data. The receiving device must extract (or recover) a clock from the transitions in the received data stream. Typically a phase-locked loop (PLL) is used to phase-lock to the received data and control the frequency of a new, local clock (the "recovered clock"). The recovered clock is then used to sample and re-time ("recover") the received data.

Figure 1A:
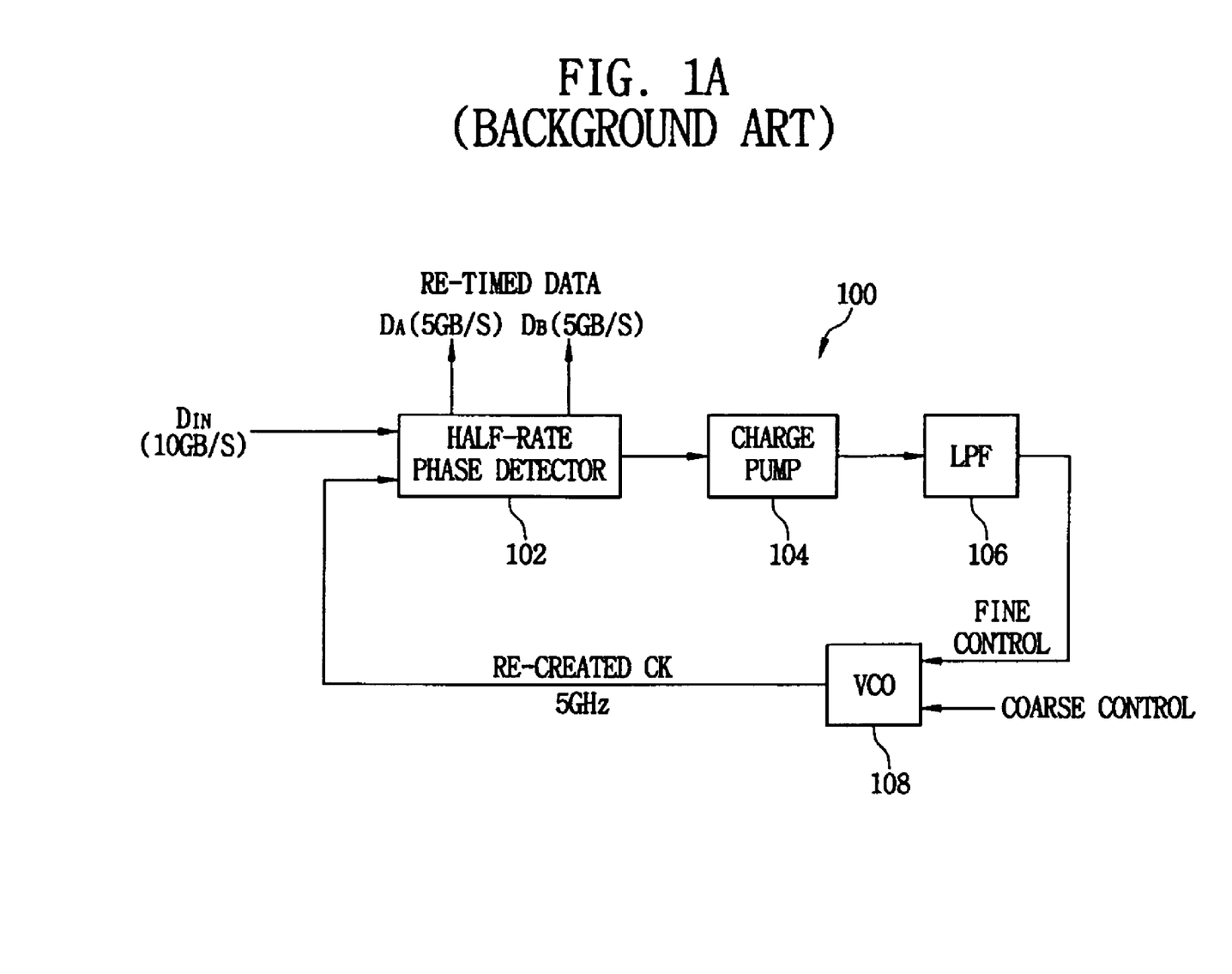
FIG. 1A is a block diagram depicting a known clock and data recovery (CDR) circuit 100 according to the Background Art.

FIG. 1A is a block diagram depicting a known clock and data recovery (CDR) circuit 100 according to the Background Art, corresponding to published U.S. Patent Application, Publication No. 2002/0021470. CDR circuit 100 includes: a half-rate phase detector 102; a charge pump 104; a low pass filter (LPF) 106; and a half-rate voltage-controlled oscillator (VCO) 108. Phase-detector 102 produces a signal that is proportional to the phase difference between the received data ($D_{in}$) and a locally re-created clock (CK). The clock has a rate that is half of the rate of received data $D_{in}$, hence phase detector 102 is described as a half-rate phase detector. Where $D_{in}$ has a rate of 10 Gb/sec, the rate of re-created clock CK is 5 GHz.

Charge pump 104 discharges or charges according to the output of phase-detector 102. VCO 108 receives a filtered (via LPF 106) output of charge pump 104, which represents a fine control input, and a relatively coarse control input, and re-creates the clock (CK).

Phase detector 102 also outputs two recovered data signals ($D_A$ and $D_B$), each of which has a rate of 5 Gb/sec. Together, $D_A$ and $D_B$ represent a recovered and re-timed version of received data $D_{in}$.

Figure 1B:
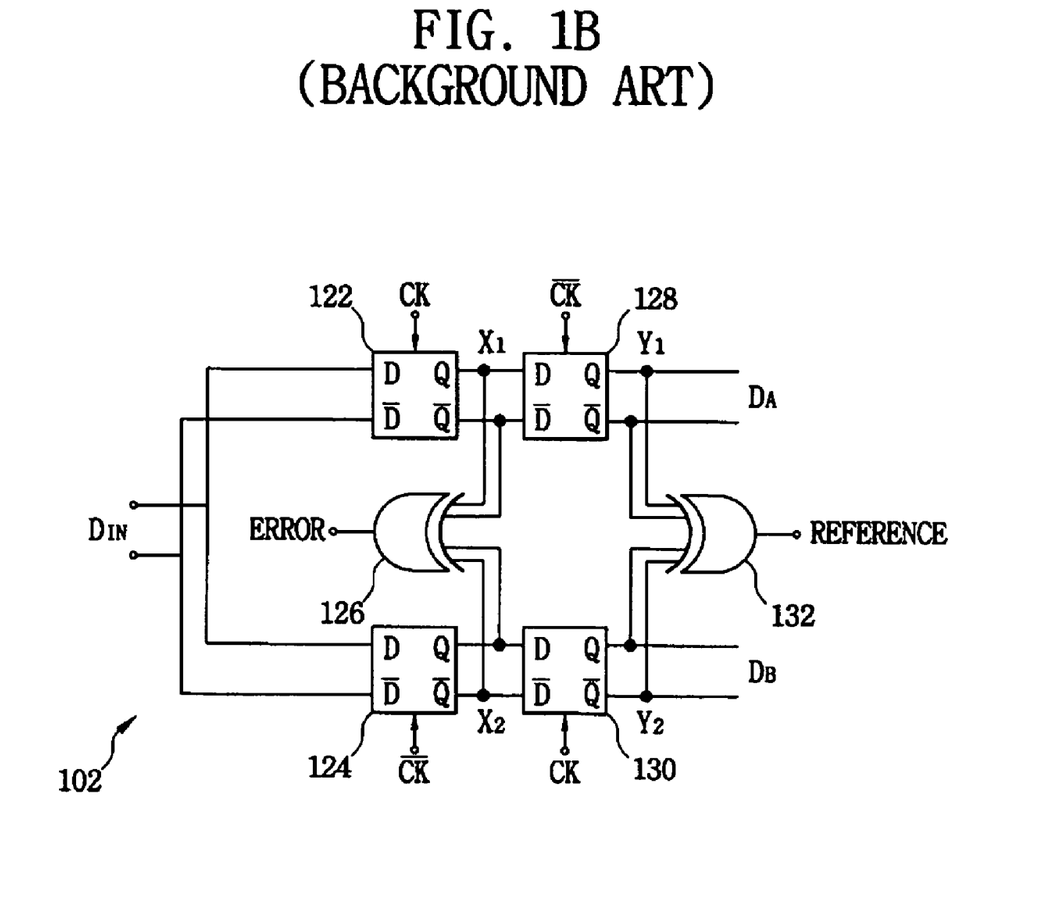
FIG. 1B is a more detailed block diagram of the phase detector of FIG. 1A.

FIG. 1B is a more detailed block diagram of phase detector 102 according to the Background Art, which includes: a pair of data latches 122 and 124, a corresponding exclusive-OR (XOR) gate 126; another pair of data latches 128 and 130, and their corresponding XOR gate 132. It is noted that non-inverted signals in FIG. 1B have an inverted counterpart; for simplicity of illustration, however, the inverted counterparts have not been labeled, e.g., FIG. 1B does not show the labels $\overline{D_{in}}$, $\overline{X_1}$, etc.

Outputs X1 and X2 of latches 122 and 124 are combined by XOR gate 126 to produce the phase difference signal (labeled "ERROR" in FIG. 1B). Similarly, XOR 132 combines outputs Y1 and Y2 of latches 128 and 130, respectively. It is noted that, in contrast to signal ERROR, the output of XOR 132 does not vary in pulse width, hence it is given the label "REFERENCE."

SUMMARY

An embodiment of the present invention provides a quarter-rate phase detector. Such a phase detector may include: four latches controllable to latch, at different times according to quadrature clock signals, respectively, data received by the phase detector so as to form latched signals; and error circuit to combine corresponding ones of the latched signals, respectively, the error circuit providing a plurality of intermediate signals; and a multiplexing unit to selectively output the intermediate signals as a phase error signal. A related method can have similar features.

Additional features and advantages of the present invention will be more fully apparent from the following detailed description of example embodiments, the accompanying drawings and associated claims.

The accompanying drawings are intended to depict example embodiments of the present invention and should not be interpreted to limit the scope thereof.

DETAILED DESCRIPTION OF PREFERRED EMBODIMENTS

Hereinafter, embodiments of the present invention will be described in detail with reference to the attached drawings. However, the embodiments of the present invention may be modified into various other forms, and the scope of the present invention must not be interpreted as being restricted to the embodiments. The embodiments are provided to more completely explain the present invention to those skilled in the art. The drawings are not to scale and so may exhibit exaggerations for clarity. Like numbers refer to like elements throughout.

Figure 2:
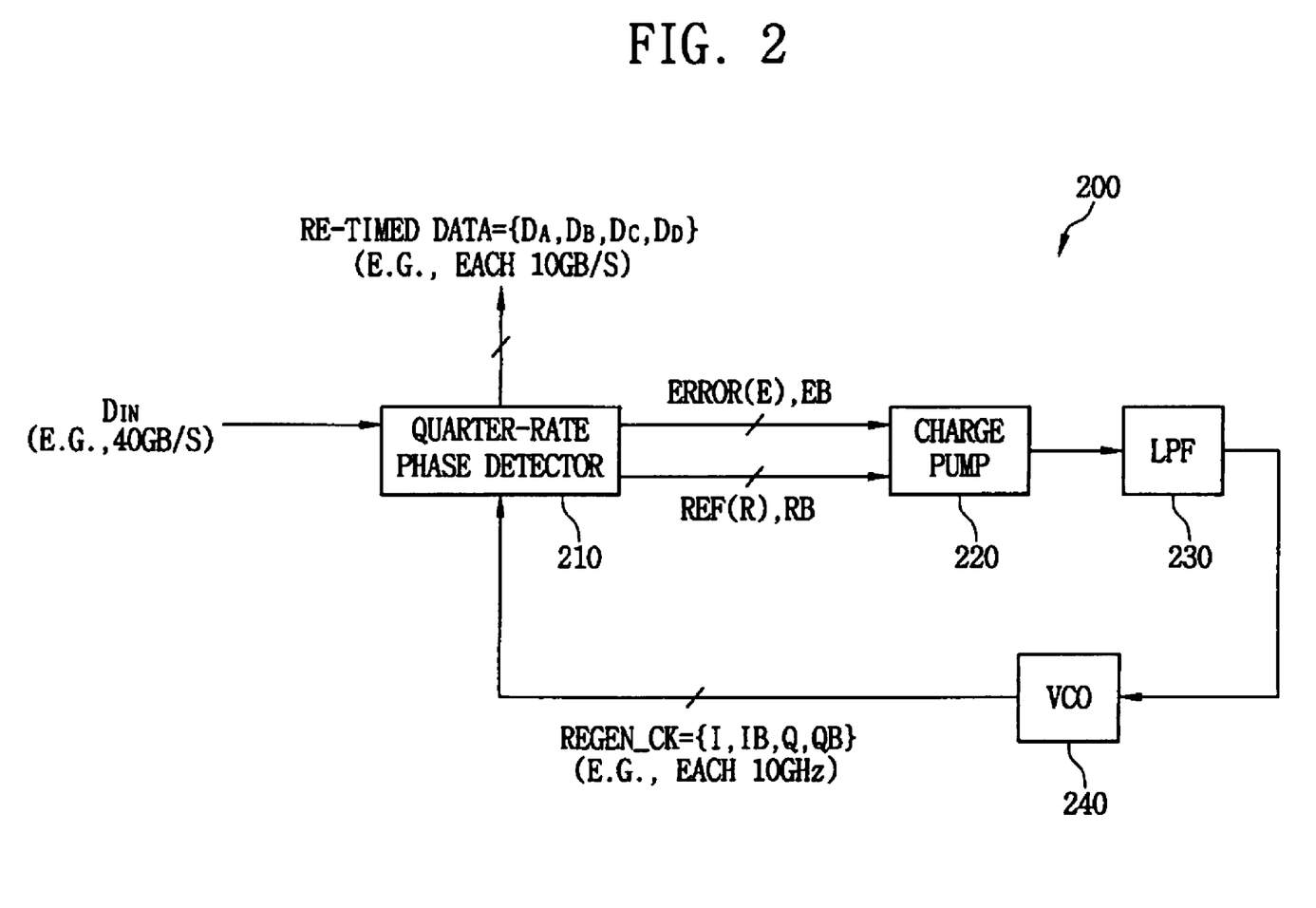
FIG. 2 is a block diagram depicting a clock and data recovery (CDR) circuit according to an embodiment of the present invention.

FIG. 2 is a block diagram depicting a clock and data recovery (CDR) circuit 200 according to an embodiment of the present invention. CDR circuit 200 is a phase-locked loop. CDR 200 includes: a quarter-rate phase detector 210 (according to another embodiment of the present invention) that operates upon the received data ($D_{in}$); a charge pump 220; a low pass filter (LPF) 230; and a quadrature voltage-controlled oscillator (VCO) 240.

Phase-detector 210 produces: an error signal (E) and its corresponding inverse signal (Eb) whose pulse widths are proportional to the difference in phase between latched versions of the received data ($D_{in}$) and a locally regenerated clock (reGen_CK) and its corresponding inverse ($\overline{\text{reGen\_CK}}$), respectively; and a reference signal (R) and its corresponding inverse signal (Rb) whose pulse widths are not proportional to the difference in phase between twice latched versions of received data $D_{in}$ and a locally regenerated clocks reGen_CK and $\overline{\text{reGen\_CK}}$, respectively. Signals R and Rb have pulse widths that are substantially constant. Charge pump 220 discharges or charges according to the difference in pulse widths of the outputs of phase-detector 210, e.g., E and R. VCO 240 receives a filtered (via LPF 230) output of charge pump 220 and produces clocks reGen_CK and $\overline{\text{reGen\_CK}}$.

Clock reGen_CK has two signals, I and Q. Similarly, clock $\overline{\text{reGen\_CK}}$ has the corresponding inverse signals, Ib and Qb. The use of labels I, Ib, Q and Qb is explained as follows. Signals Q/Qb exhibit a phase lag of 90° relative to signals I/Ib, respectively, and are described as being (relatively) in quadrature; hence, labels Q and Qb are used. Signals I/Ib are not out of phase, i.e., they are in phase; hence, labels I and Ib are used.

Figure 3A:
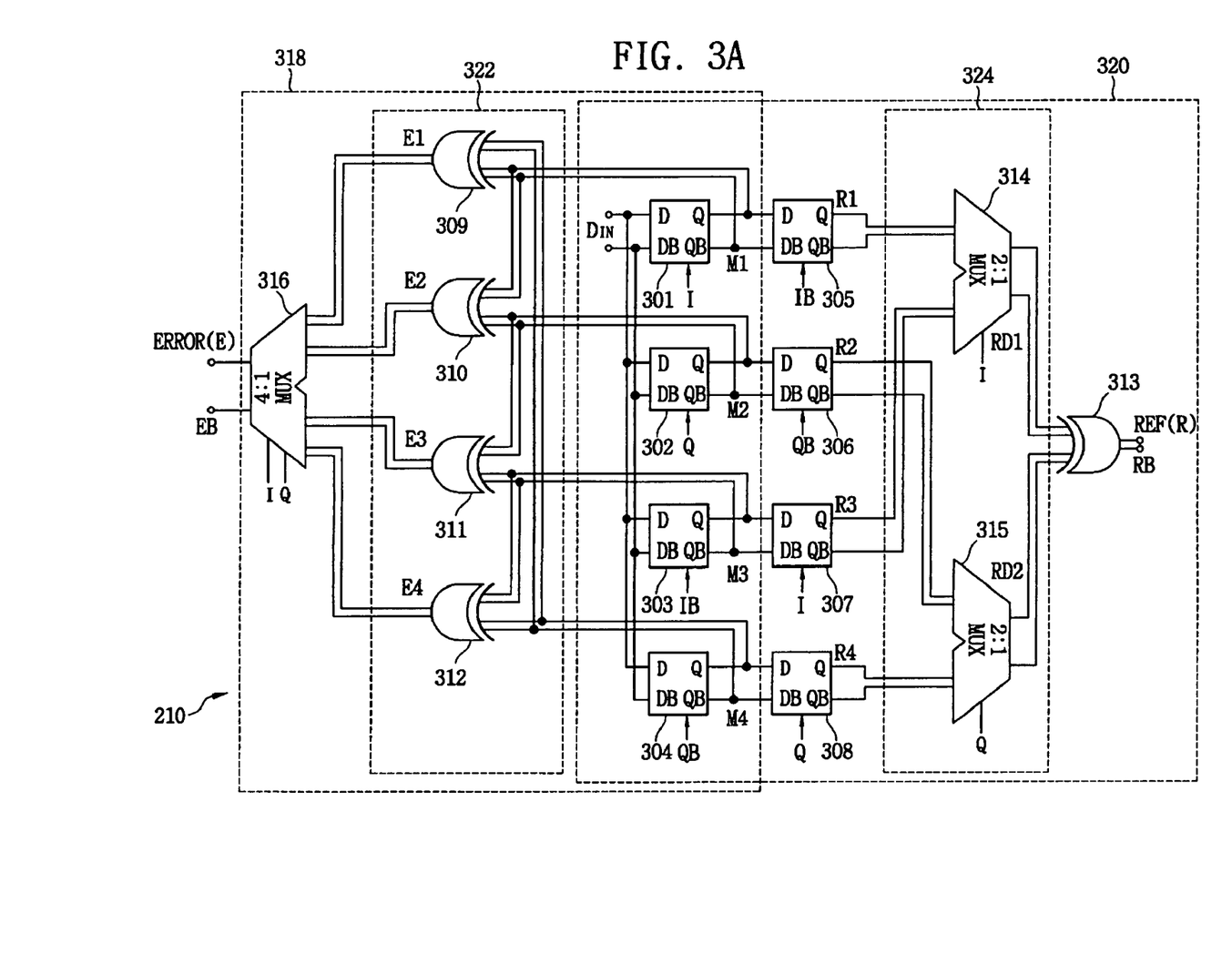
FIG. 3A is a block diagram depicting a quarter-rate phase detector according to an embodiment of the present invention.

FIG. 3A is a block diagram depicting quarter-rate phase detector 210 of FIG. 2 in more detail, according to an embodiment of the present invention. Quarter rate phase-detector 210 includes: error signal generation logic circuitry 318 that produces components of signal E, namely intermediate signals e1-e4; and reference signal generation logic circuitry 320 that produces components of signal R, namely signals r1-r4. Logic 320 overlaps logic 318 in the sense that both can be described as including a bank of four data latches 301-304. Logic 318 further includes: neighbor logic circuitry 322; and a 4:1 multiplexer 316. Logic 320 further includes: a second bank of data latches 305-308 cascade-connected to latches 301-304, respectively; and a MUX unit 324. Neighbor logic 322 includes XOR gates 309-311. MUX unit 324 includes 2:1 multiplexers 314 and 315.

Figure 3B:
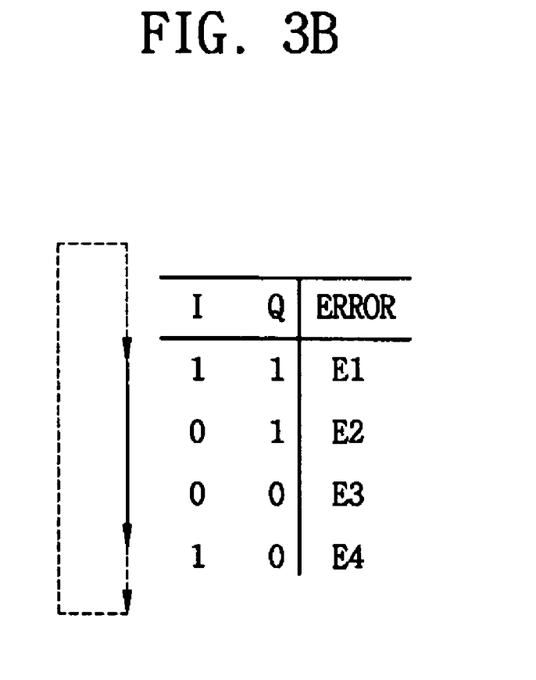
FIG. 3B is a table depicting an example truth table for a multiplexer according to an embodiment of the present invention.

In FIGS. 3A and 3B, some simplifications have been made for the purpose of illustration. Those simplifications include the following. Each of data latches 301-304 receives signal $D_{in}$ and its inverted counterpart, and each provides signals at their Q and Qb outputs, but only the labels for the signals at the Q outputs (namely, m1-m4, respectively) are explicitly depicted. Data latches 305-308 provide signals at their Q and Qb outputs, but only the labels for signals at the Q outputs (namely, r1-r4, respectively) are explicitly depicted. Multiplexers 314 and 315 output signals and their inverted counterparts, but only the non-inverted signals (namely, rd1 and rd2, respectively) are explicitly labeled. XOR gates 309-312 provide signals and their inverted counterparts, but only the non-inverted signals (namely, e1-e4, respectively) are explicitly labeled. One of ordinary skill in the art will understand that the labels for the inverted counterparts, e.g., $\overline{\text{e1}}$-$\overline{\text{e4}}$, etc. are implied.

Operation of error signal generation logic 318 is as follows. Signals $D_{in}$ and $\overline{D_{in}}$ are provided at inputs D and Db to each of latches 301-304, while corresponding signals m1-m4 and $\overline{\text{m1}}$-$\overline{\text{m4}}$ (latched according to clock signals I, Q, Ib and Qb) are made available on outputs Q and Qb, respectively. Signals m1, $\overline{\text{m1}}$ are fed to inputs of XOR gates 309-310. In similar cyclic fashion, signals m2, $\overline{\text{m2}}$ are fed to inputs of XOR gates 310-311, and m3, $\overline{\text{m3}}$ are fed to inputs of XOR gates 310-311. In corresponding cyclic fashion, signals m4, $\overline{\text{m4}}$ are fed to an input of XOR gate 311 and to the other inputs of XOR gate 309.

The exhibition of non-zero phase difference in signals e1-e4 at outputs of XOR gates 309-312 moves cyclically in a sequence e1, e2, e3, e4, e1, etc.; the same applies for signals $\overline{\text{e1}}$-$\overline{\text{e4}}$. Hence, Outputs e1-e4 and $\overline{\text{e1}}$-$\overline{\text{e4}}$ are fed to multiplexer 316, which selects a pair $e_j$ and $\overline{e_j}$ according to signals I and Q. As multiplexer 316 is controlled to select a subsequent different pair $e_{j+1}$ and $\overline{e_{j+1}}$, etc., the effect is to construct samples E and Eb as a serial sequence of cyclically repeated samples of signals $e_j$ and $\overline{e_j}$, respectively. Whereas phase detector 102 according to the Background Art extracted the error signal directly from XOR gate 126, phase detector 210 (according to an embodiment of the present invention) indirectly extracts E and Eb by way of multiplexer 316 interposed between XOR gates 309-312 and outputs of phase detector 210.

Figure 3C:
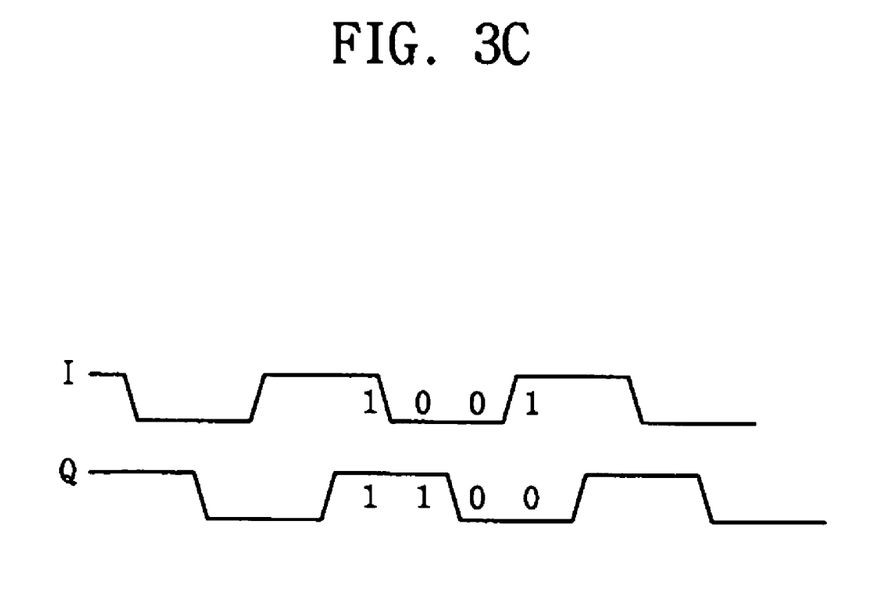
FIG. 3C depicts waveforms I and Q as they change to exhibit the combinations listed in the table of FIG. 3B.

FIG. 3B is a table depicting an example truth table for multiplexer 316 according to an embodiment of the present invention. For each combination of signals I and Q, the particular signal $e_j$ selected by multiplexer 316 is shown. FIG. 3C depicts waveforms I and Q as they change to exhibit the combinations listed in FIG. 3B.

Figure 3D:
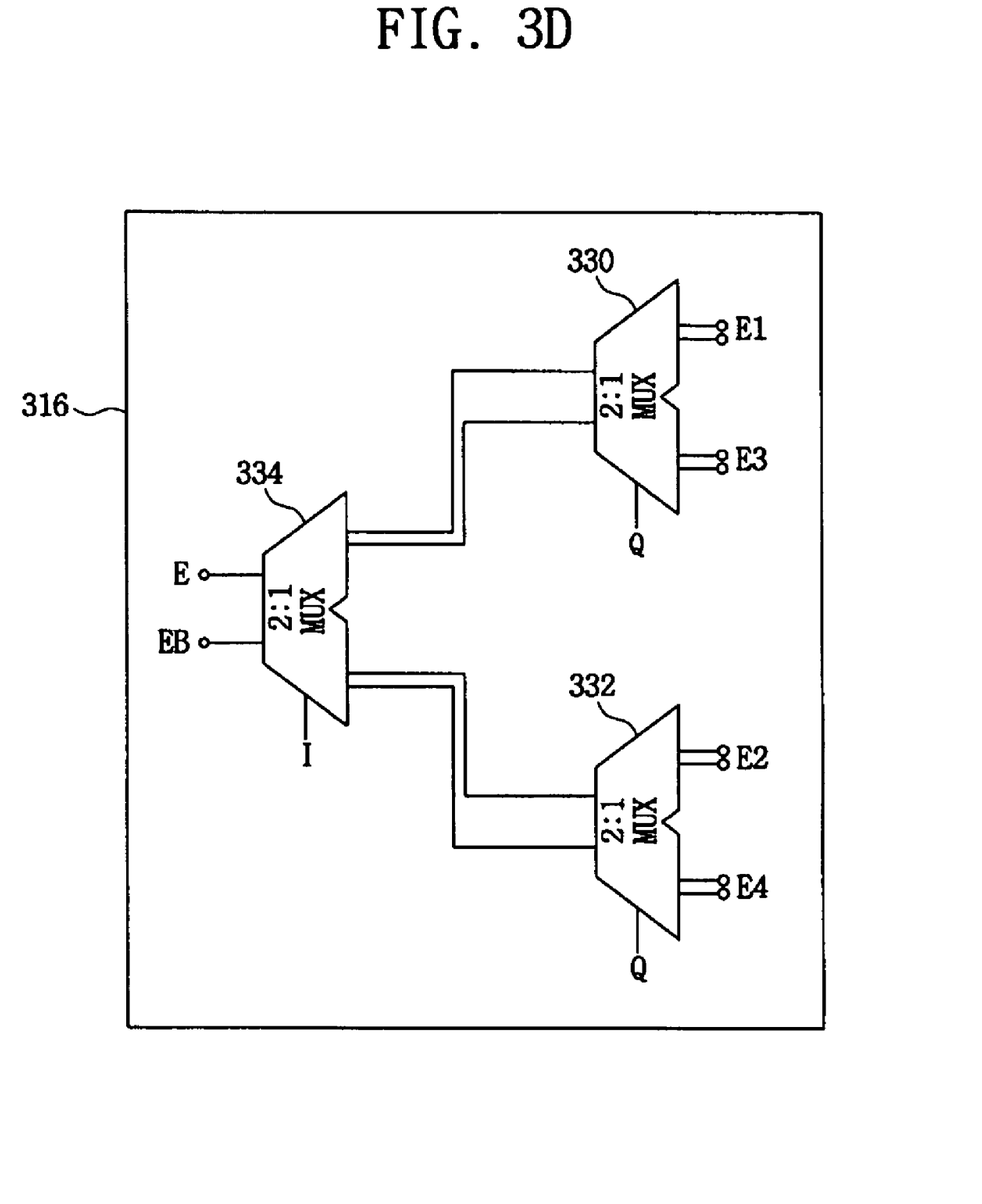
FIG. 3D is a block diagram depicting a multiplexer, according to an embodiment of the present invention, whose operation corresponds to the table of FIG. 3B.

FIG. 3D is a block diagram depicting multiplexer 316 in more detail, according to an embodiment of the present invention. Multiplexer 316 includes: 2:1 multiplexers 330 and 332 can receive signals $e_1, \overline{e_1}, e_3, \overline{e_3}$ and $e_2, \overline{e_2}, e_4, \overline{e_4}$, respectively. Selections of multiplexers 330 and 332 can be controlled according to signal Q. Multiplexer 334 can receive, and selects from, the outputs of multiplexers 330 and 332 according to signal I to produce signals E and Eb.

Operation of reference signal generation logic 320 is as follows. Signals m1-m4 and $\overline{\text{m1}}$-$\overline{\text{m4}}$ are provided at inputs D and Db to each of latches 305-309, while corresponding signals r1-r4 and $\overline{\text{r1}}$-$\overline{\text{r4}}$ (latched according to clock signals Ib, Qb, I and Q) are made available on outputs Q and Qb, respectively. Multiplexer 314 can receive, and selects from, signals r1, $\overline{\text{r1}}$ and r3, $\overline{\text{r3}}$ according to signal I so as to produce signals rd1, $\overline{\text{rd1}}$. Multiplexer 315 can receive, and selects from, signals r2, $\overline{\text{r2}}$ and r4, $\overline{\text{r4}}$ according to signal Q so as to produce signals rd2, $\overline{\text{rd2}}$. Outputs rd1, $\overline{\text{rd1}}$ and outputs rd2, $\overline{\text{rd2}}$ can be fed to XOR gate 313, which produces signals R and Rb. As multiplexer 314 is controlled to select between signals r1, $\overline{\text{r1}}$ and r3, $\overline{\text{r3}}$, the effect is to construct signals rd1, $\overline{\text{rd1}}$ as serial sequences of alternating samples of signals r1, $\overline{\text{r1}}$ and r3, $\overline{\text{r3}}$; likewise for multiplexer 315.

For example, where a rate of $D_{in}$ is 40 Gb/sec, then the corresponding rate of regenerated clock signals I, Ib, Q and Qb is 10 GHz. In other words, signals I, Ib, Q and Qb are ¼ of the rate of $D_{in}$. As phase detector 210 operates upon signals I, Ib, Q and Qb, it can be described as a quarter-rate phase detector. Extending the example, signals e1-e4, $\overline{\text{e1}}$-$\overline{\text{e4}}$ and r1-r4, $\overline{\text{r1}}$-$\overline{\text{r4}}$ would each have a rate of 10 Gb/sec or ¼ of the rate of $D_{in}$.

Operation of CDR circuit 200 is as follows. It is to be noted that signals r1-r4, $\overline{\text{r1}}$-$\overline{\text{r4}}$ represent re-timed data signals $D_A$-$D_D$, $\overline{D_C}$-$\overline{D_D}$, respectively. In other words, the retimed ¼ rate data signals are inherently generated at outputs of latches 305-308 as part of the generation of signals R and Rb.

Figure 4:
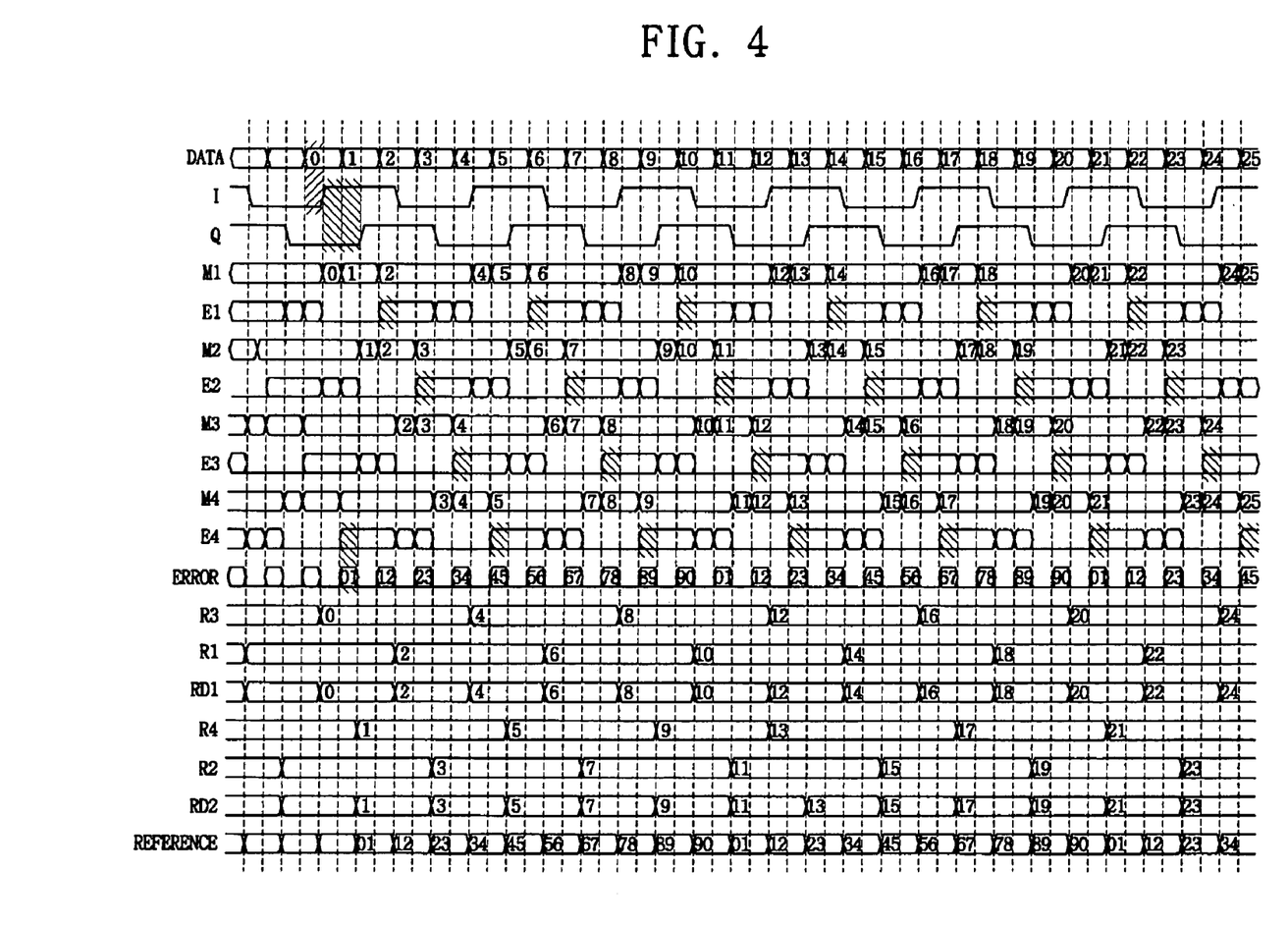
FIGS. 4, 5 and 6 each depict waveforms for signals mentioned FIG. 3A, for different example circumstances, respectively.
Figure 5:
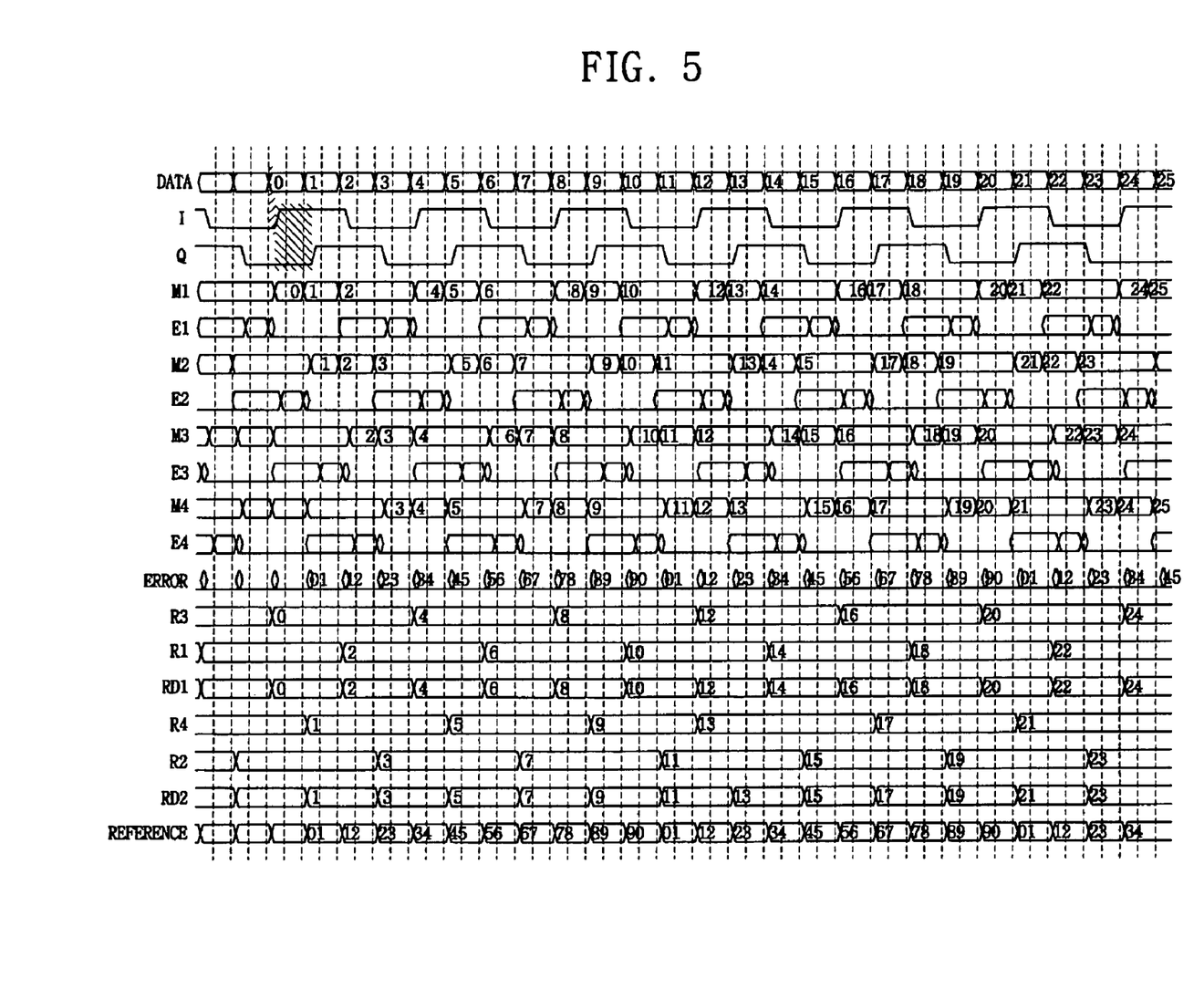
Figure 6:
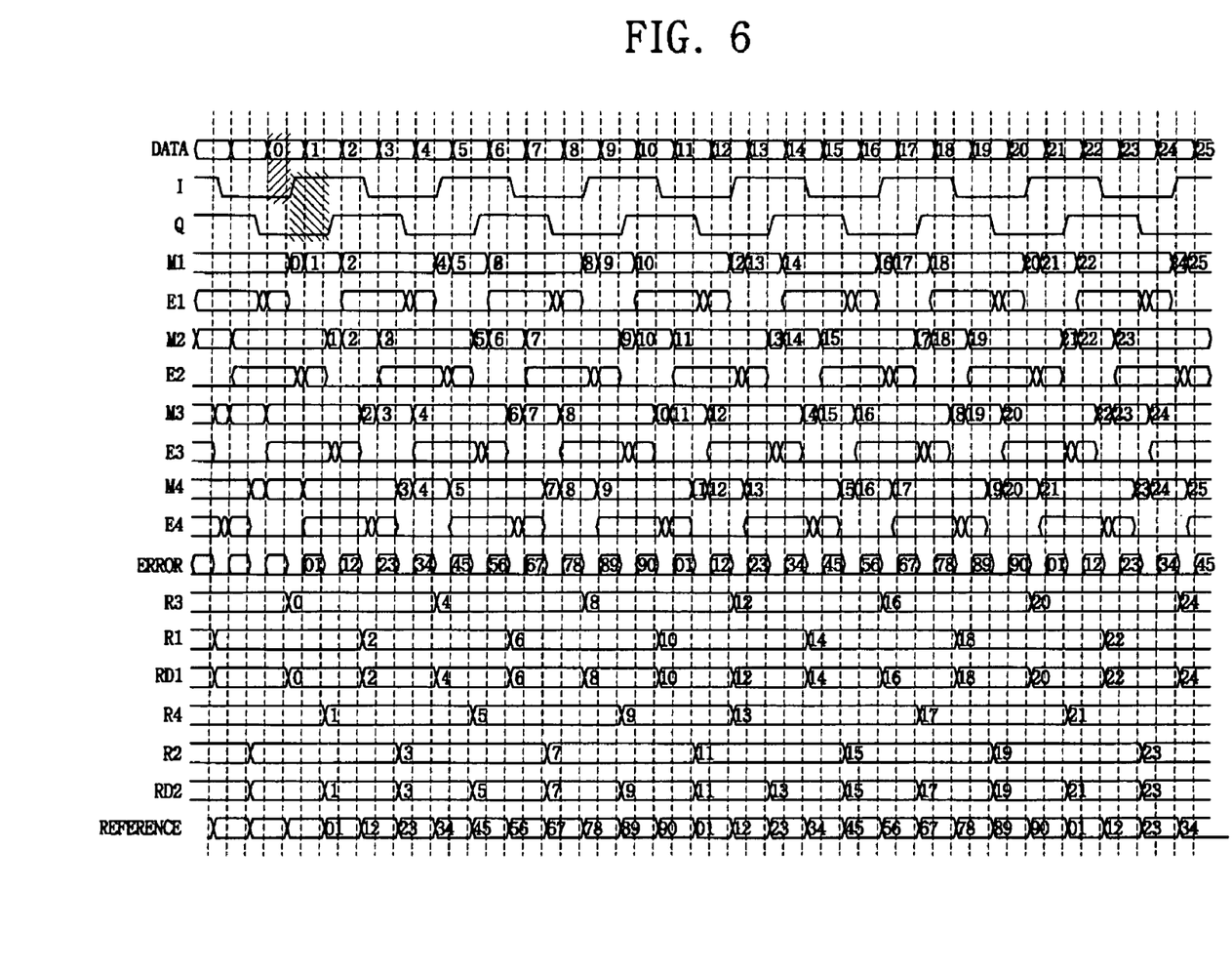

FIG. 4 depicts waveforms for signals mentioned above in the example circumstance when the clock is locked. Error signals E, Eb have a signal width $\Theta_E$ that is half of the signal width $\Theta_R$ (relative to $D_{in}, \overline{D_{in}}$) of signals R, Rb. In this case, total phase error is taken as the difference between signal width $\Theta_R$ and twice the value of signal width $\Theta_E$, namely $2\Theta_E$. Charge pump 220 discharges when $2\Theta_E$ is less than $\Theta_R$ and charges when $2\Theta_E$ is greater than $\Theta_R$. When $2\Theta_E$ equals $\Theta_R$, the clock is locked. FIG. 5 depicts waveforms for signals mentioned above in the example circumstance that error signals E, Eb lead $D_{in}, \overline{D_{in}}$, namely where $2\Theta_E < \Theta_R$. FIG. 6 depicts waveforms for signals mentioned above in the example circumstance that error signals E, Eb lag $D_{in}, \overline{D_{in}}$, namely where $2\Theta_E > \Theta_R$.

The present invention may be embodied in other forms without departing from its spirit and essential characteristics. The described embodiments are to be considered only non-limiting examples of the present invention. The scope of the present invention is to be measured by associated claims. All changes which come within the meaning and equivalency of the claims are to be embraced within their scope.

What is claimed is:

1. A quarter-rate phase detector comprising:
 a first set of four latches controllable to latch, at different times according to quadrature clock signals, respectively, data received by the quarter-rate phase detector so as to form a first set of latched signals;

an error circuit to combine corresponding ones of the first set of latched signals, respectively, resulting in a plurality of intermediate signals;

a multiplexing unit to selectively output the intermediate signals as a phase error signal; and a second set of four latches arranged to receive outputs of the first set of latches, respectively, and controllable to latch data at different times according to the quadrature clock signals, respectively, so as to form a second set of latched signals.

2. The quarter-rate phase detector of claim 1, wherein:
the quadrature clock signals include signals I, Q, Ib and Qb;
a first one of at least one of the first set of four latches and the second set of the four latches is controlled by I;
a second one of at least one of the first set of four latches and the second set of the four latches is controlled by Q;
a third one of at least one of the first set of four latches and the second set of the four latches controlled by Ib; and
a fourth one of at least one of the first set of four latches and the second set of the four latches is controlled by Qb.

3. The quarter-rate phase detector of claim 1, wherein the multiplexing unit is controllable by the quadrature clock signals.

4. The quarter-rate phase detector of claim 1, wherein the multiplexing unit is controllable to truncate the intermediate signals.

5. The quarter-rate phase detector of claim 4, wherein the multiplexing unit is operable to form the phase error signal by cycling through the truncated intermediate signals.

6. The quarter-rate phase detector of claim 1, wherein:
the quadrature clock signals include signals I and Q; and
the multiplexing unit is controlled according to the signals I and Q, respectively.

7. The quarter-rate phase detector of claim 6, wherein the multiplexing unit includes:
a first multiplexer and a second multiplexer to receive the intermediate signals, respectively; and
a third multiplexer to multiplex outputs of the first and second multiplexers.

8. The quarter-rate phase detector of claim 1, wherein the corresponding ones of the first set of latched signals are pairs of latched signals; and
each pair has a first signal and a second signal, the second signal representing a latched signal subsequently closest in time to the first signal, respectively.

9. The quarter-rate phase detector of claim 8, wherein:
the error circuit includes four exclusive OR (XOR) gates, each XOR gate receiving one of the pairs, respectively.

10. The quarter-rate phase detector of claim 1, wherein:
the second set of four latches represents re-timed versions of the received data.

11. The quarter-rate phase detector of claim 1, wherein:
the second set of latched signals is organized as pairs;
the detector further comprises:
a reference circuit to generate a reference signal based upon transitions in the second set of latched signals.

12. The quarter-rate phase detector of claim 11, wherein:
the second set of latched signals is organized as pairs;
the reference circuit includes:
a plurality of multiplexers to selectively output the pairs of re-timed data; and
an exclusive OR (XOR) gate to receive the outputs of the plurality of multiplexers.

13. The quarter-rate phase detector of claim 1, wherein the rate of the intermediate signals is ¼ of the received data rate.

14. A quarter-rate phase detector comprising:
a first set of four data latches, each latch receiving the same input data, the latches being clocked by quadrature clock signals, respectively, so as to produce a first set of latched signals;

an error signal-generating circuit configured to generate a phase error signal based upon first set of latched signals and the quadrature clocks signals; and a second set of four latches arranged to receive outputs of the first set of latches, respectively, and controllable to latch data at different times according to the quadrature clock signals, respectively, so as to form a second set of latched signals.

15. The quarter-rate phase detector of claim 14, wherein the error-signal-generating circuit is operable upon the first set of four latched signals and is controlled by the quadrature clocks signals.

16. A quarter-rate phase detector comprising:
a first set of four latches controllable to latch, at different times according to quadrature clock signals, respectively, data received by the quarter-rate phase detector so as to form a first set of latched signals output to a phase-error generating circuit;

a second set of four latches arranged to receive outputs of the first set of latches, respectively, and controllable to latch data at different times according to the quadrature clock signals, respectively, so as to form a second set of latched signals output to determine a reference signal, wherein the phase-error generating circuit comprising:
four XOR gates receiving the first set of latched signals, each of the XOR gates receiving the first set of latched signal and its inverted counterpart corresponding to input data latched according to one of quadrature clock signals, respectively, each XOR gate generating an intermediate signal forming four intermediate signals; and
a multiplexer to selectively output one of the four intermediate signals as a phase error signal.

17. The quarter-rate phase detector of claim 16, further comprising:
four data latches, each latch receiving the same input data, the latches being clocked by quadrature clock signals, respectively, so as to produce quadrature latched data signals.

18. A clock and data recovery (CDR) circuit comprising:
a phase-error generating circuit to determine an error signal output by a quarter-rate phase detector;
a charge pump operable upon an output of the phase detector;
a filter operable upon an output of the charge pump; and
a quadrature voltage-controlled oscillator (VCO) operable upon an output of the filter;
the phase-detector being controllable by the output of the VCO, wherein the quarter-rate phase detector includes
a first set of four latches controllable to latch, at different times according to quadrature clock signals, respectively, data received by the quarter-rate phase detector so as to form a first set of latched signals output to the phase-error generating circuit, and
a second set of four latches arranged to receive outputs of the first set of latches, respectively, and controllable to latch data at different times according to the quadrature clock signals, respectively, so as to form a second set of latched signals output to determine a reference signal.

19. The CDR circuit of claim 18, wherein the rate of the quadrature signals of VCO is ¼ of the received data rate of the phase-error generating circuit.

20. A method of detecting phase at a quarter of the rate of the received data, the method comprising:
  latching, at different times according to quadrature clock signals, respectively, the received data at a first set of data latches so as to form latched signals;
  combining corresponding ones of the latched signals, respectively, to provide a plurality of intermediate signals;
  selectively outputting one among the intermediate signals, respectively, to provide a constructed a phase error signal;
  receiving the latched signals at a second set of latches at different times according to the quadrature clock signals to produce a returned version of the received data; and
  outputting a reference signal based on the latched signals.

21. The method of claim 20, wherein:
  the quadrature clock signals include signals I and Q; and
  the selectively outputting step selectively outputs according to the signals I and Q, respectively.

22. The CDR circuit of claim 20, wherein the rate of the quadrature clock signals is ¼ of the received data rate.

* * * * *